US010438947B2

(12) United States Patent
Nishimura et al.

(10) Patent No.: US 10,438,947 B2
(45) Date of Patent: Oct. 8, 2019

(54) SEMICONDUCTOR DEVICE, MANUFACTURING METHOD THEREFOR AND SEMICONDUCTOR MODULE

(71) Applicant: Mitsubishi Electric Corporation, Tokyo (JP)

(72) Inventors: Kazuhiro Nishimura, Fukuoka (JP); Makoto Ueno, Fukuoka (JP); Masataka Mametuka, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/536,353

(22) PCT Filed: Jan. 13, 2015

(86) PCT No.: PCT/JP2015/050641
§ 371 (c)(1),
(2) Date: Jun. 15, 2017

(87) PCT Pub. No.: WO2016/113841
PCT Pub. Date: Jul. 21, 2016

(65) Prior Publication Data
US 2017/0345817 A1    Nov. 30, 2017

(51) Int. Cl.
*H01L 27/06* (2006.01)
*H01L 29/739* (2006.01)
(Continued)

(52) U.S. Cl.
CPC ...... *H01L 27/0647* (2013.01); *H01L 21/8222* (2013.01); *H01L 23/52* (2013.01);
(Continued)

(58) Field of Classification Search
CPC ..... H01L 27/11807; H01L 2027/11881; H01L 2027/11888
See application file for complete search history.

(56) References Cited

U.S. PATENT DOCUMENTS 5,798,538 A    8/1998    Nadd et al.
6,169,299 B1 *    1/2001    Kawaji ............... H01L 29/0649
257/137
(Continued)

FOREIGN PATENT DOCUMENTS

JP    H04-0196359 A    7/1992
JP    2000-183341 A    6/2000
(Continued)

OTHER PUBLICATIONS

International Preliminary Report on Patentability issued in PCT/JP2015/050641; dated Jul. 27, 2017; with a Notification of Transmittal of its English Translation.
(Continued)

*Primary Examiner* — Zandra V Smith
*Assistant Examiner* — Andre C Stevenson
(74) *Attorney, Agent, or Firm* — Studebaker & Brackett PC

(57) ABSTRACT

A semiconductor device of the present invention achieves improved avoidance of a parasitic operation in a circuit region while achieving miniaturization of the semiconductor device and a reduction in the amount of time for manufacturing the semiconductor device. The semiconductor device according to the present invention includes an IGBT disposed on a first main surface of a semiconductor substrate provided with a drift layer of a first conductivity type; a thyristor disposed on the first main surface of the semiconductor substrate; a circuit region; a hole-current retrieval region separating the IGBT and the circuit region in a plan view; and a diffusion layer of a second conductivity type, the diffusion layer being disposed on a second main surface of the semiconductor substrate. The IGBT has an effective area equal to or less than an effective area of the thyristor in a plan view.

15 Claims, 14 Drawing Sheets

(51) Int. Cl.
*H01L 29/74* (2006.01)
*H01L 21/8222* (2006.01)
*H01L 29/06* (2006.01)
*H01L 29/66* (2006.01)
*H01L 27/07* (2006.01)
*H01L 23/52* (2006.01)
*H01L 27/092* (2006.01)

(52) U.S. Cl.
CPC ...... *H01L 27/0623* (2013.01); *H01L 27/0705* (2013.01); *H01L 29/0646* (2013.01); *H01L 29/66325* (2013.01); *H01L 29/739* (2013.01); *H01L 29/7393* (2013.01); *H01L 29/74* (2013.01); *H01L 29/7404* (2013.01); *H01L 27/0727* (2013.01); *H01L 27/0922* (2013.01)

(56) References Cited

U.S. PATENT DOCUMENTS

| | | | |
|---|---|---|---|
| 6,218,709 B1 | 4/2001 | Yasuda | |
| 6,365,932 B1* | 4/2002 | Kouno | H01L 27/0255 257/133 |
| 6,649,981 B2 | 11/2003 | Kobayashi et al. | |
| 6,949,798 B2 | 9/2005 | Nitta et al. | |
| 7,470,952 B2 | 12/2008 | Ruething et al. | |
| 7,534,666 B2 | 5/2009 | Francis et al. | |
| 7,787,225 B2 | 8/2010 | Nishimura | |
| 8,039,879 B2 | 10/2011 | Ueno | |
| 8,605,408 B2 | 12/2013 | Godo et al. | |
| 2002/0171116 A1* | 11/2002 | Kelberlau | H01L 29/0619 257/502 |
| 2006/0255361 A1* | 11/2006 | Oyabe | G01K 7/015 257/139 |
| 2007/0120181 A1 | 5/2007 | Ruething et al. | |
| 2009/0050932 A1* | 2/2009 | Lu | H01L 21/84 257/139 |
| 2009/0114946 A1 | 5/2009 | Ueno | |
| 2014/0345583 A1* | 11/2014 | Ueno | F02P 3/051 123/652 |
| 2015/0108564 A1* | 4/2015 | Miura | H01L 21/046 257/329 |
| 2015/0364588 A1* | 12/2015 | Laven | H01L 29/0615 257/139 |

FOREIGN PATENT DOCUMENTS

| | | |
|---|---|---|
| JP | 2002-359373 A | 12/2002 |
| JP | 2003-318399 A | 11/2003 |
| JP | 2004-363327 A | 12/2004 |
| JP | 2008-112828 A | 5/2008 |
| JP | 2009-503850 A | 1/2009 |
| JP | 2009-105265 A | 5/2009 |
| JP | 2011-127444 A | 6/2011 |
| JP | 2012-054294 A | 3/2012 |
| JP | 2012-089734 A | 5/2012 |
| JP | 2012-182470 A | 9/2012 |
| WO | 2003/06549 A1 | 8/2003 |
| WO | 2007/015903 A2 | 2/2007 |

OTHER PUBLICATIONS

An Office Action issued by the Japanese Patent Office dated Sep. 26, 2017, which corresponds to Japanese Patent Application No. 2016-569148 and is related to U.S. Appl. No. 15/536,353; with English translation.

International Search Report issued in PCT/JP2015/050641; dated Feb. 17, 2015.

* cited by examiner

F I G . 2
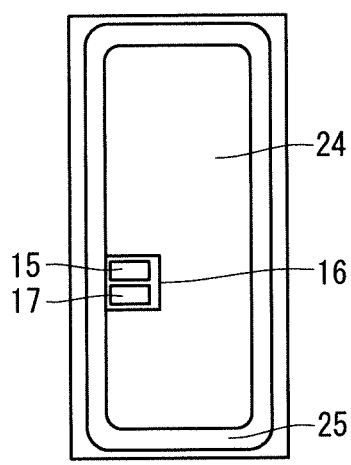

200 (300, 400)

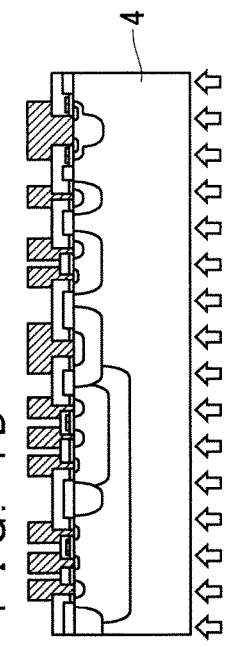
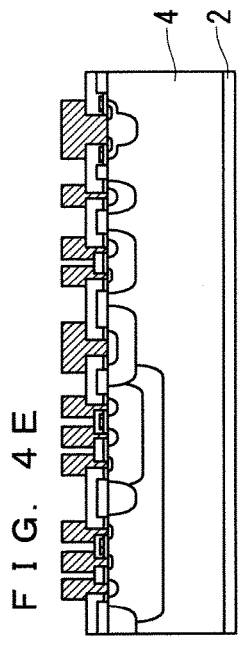
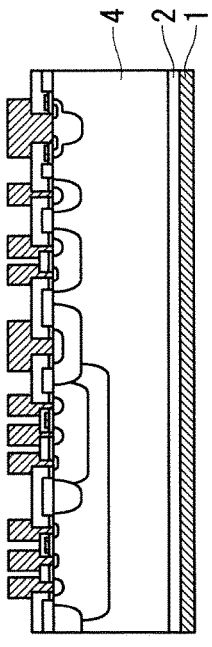
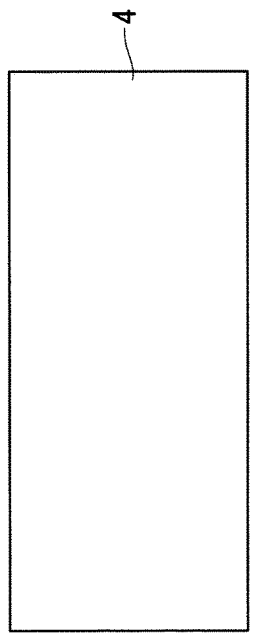
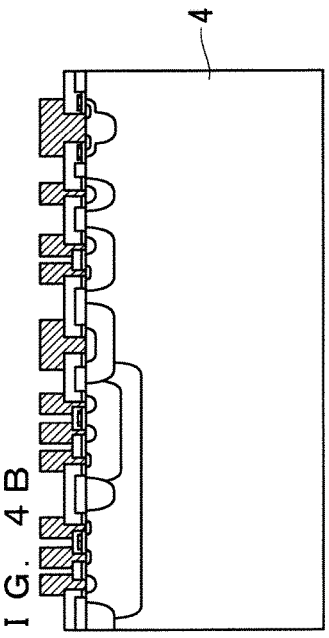
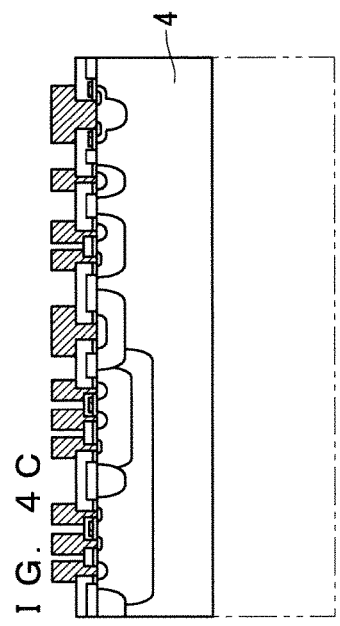

F I G . 1 5
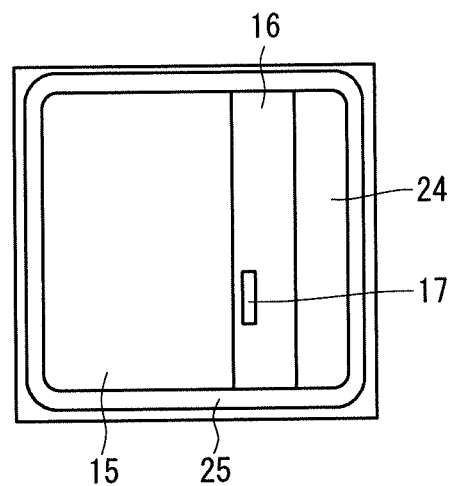

SEMICONDUCTOR DEVICE, MANUFACTURING METHOD THEREFOR AND SEMICONDUCTOR MODULE

TECHNICAL FIELD

The present invention relates to a semiconductor device, a method for manufacturing the same, and a semiconductor module, and for instance, to a semiconductor device that includes an insulated-gate bipolar transistor used in an ignition system for an internal-combustion engine such as an automobile engine.

BACKGROUND ART

In an ignition system for an internal-combustion engine such as an automobile engine, an insulated-gate bipolar transistor (hereinafter referred to as IGBT) is used as a power semiconductor device that drives an inductive load (coils of a transformer).

In the internal-combustion ignition system, an abnormal, high-voltage surge within an automobile battery, if any, causes a power loss, thus resulting in the destruction of the IGBT. The automobile battery is connected to an output (collector) terminal of the IGBT via the inductive load (coils of the transformer). In view of this, a semiconductor circuit that detects a collector voltage (equivalent to a battery voltage) of the IGBT is used to stop the operation of the IGBT during the abnormal voltage in order to avoid the destruction of the IGBT.

Referring to the detection of the collector (output) voltage of the IGBT, Patent Document 1 discloses a semiconductor device that includes an IGBT and thyristor disposed in the same semiconductor substrate.

PRIOR ART DOCUMENT

Patent Document

Patent Document 1: Japanese Patent Application Laid-Open No. 2000-183341

SUMMARY

Problem to be Solved by the Invention

As aforementioned, a conventional semiconductor device needs to establish the compatibility between the performance of the IGBT and the avoidance of a parasitic operation in a circuit region. Accordingly, the semiconductor substrate needs to be composed of an epitaxial wafer that includes a thick N+ buffer layer having a high concentration, so that the IGBT has a punch-through structure (hereinafter referred to as a PT structure). Alternatively, the IGBT and the circuit region need to be spaced apart from each other by equal to or more than a certain distance, and then a hole-current retrieval region needs to be disposed in a space therebetween. Hence, it is difficult to miniaturize the semiconductor device or reduce the amount of time for manufacturing the semiconductor device.

The present invention has been achieved to solve the above problem. It is an object of the present invention to provide a semiconductor device that includes an IGBT, thyristor, and circuit region disposed in the same semiconductor substrate, where the semiconductor device achieves improved avoidance of a parasitic operation in the circuit region while achieving miniaturization of the semiconductor device and a reduction in the amount of time for manufacturing the semiconductor device. It is also an object of the present invention to provide a method for manufacturing such a semiconductor device and to provide a semiconductor module.

Means to Solve the Problem

The semiconductor device according to the present invention includes the following: an insulated-gate bipolar transistor disposed on a first main surface of a semiconductor substrate including a drift layer of a first conductivity type; a thyristor disposed on the first main surface of the semiconductor substrate; a circuit region disposed on the first main surface of the semiconductor substrate, the circuit region including a CMOS circuit element; a hole-current retrieval region disposed on the first main surface of the semiconductor substrate, the hole-current retrieval region separating the insulated-gate bipolar transistor and the circuit region in a plan view; and a diffusion layer of a second conductivity type, the diffusion layer being disposed on a second main surface of the semiconductor substrate. The insulated-gate bipolar transistor has an effective area equal to or less than an effective area of the thyristor in a plan view.

Effects of the Invention

In the present invention, the function of the IGBT lies in the driving of a thyristor alone. This specialized function reduces a required conduction capability of the IGBT to approximately several milliamperes. In other words, this specialized function greatly reduces the amount of hole-current injections from the diffusion layer of the second conductivity type. This eliminates the need for placing a buffer layer in the semiconductor substrate, thereby enabling a reduction in the amount of time for manufacturing the semiconductor substrate.

In addition, the effective area of the IGBT is reduced by equal to or less than the effective area of the thyristor. This enables a reduced distance between the IGBT and the circuit region, and a reduced area of the hole-current retrieval region. Consequently, a small semiconductor device is achieved.

These and other objects, features, aspects and advantages of the present invention will become more apparent from the following detailed description of the present invention when taken in conjunction with the accompanying drawings.

BRIEF DESCRIPTION OF DRAWINGS

FIG. 2 is a plan view of the semiconductor device according to the first embodiment.

FIG. 4A to FIG. 4F are diagrams illustrating process steps for manufacturing the semiconductor device according to the second embodiment.

FIG. 15 is a plan view of the semiconductor device according to the prerequisite technique.

DESCRIPTION OF EMBODIMENT(S)

<Prerequisite Technique>

Figure 14:
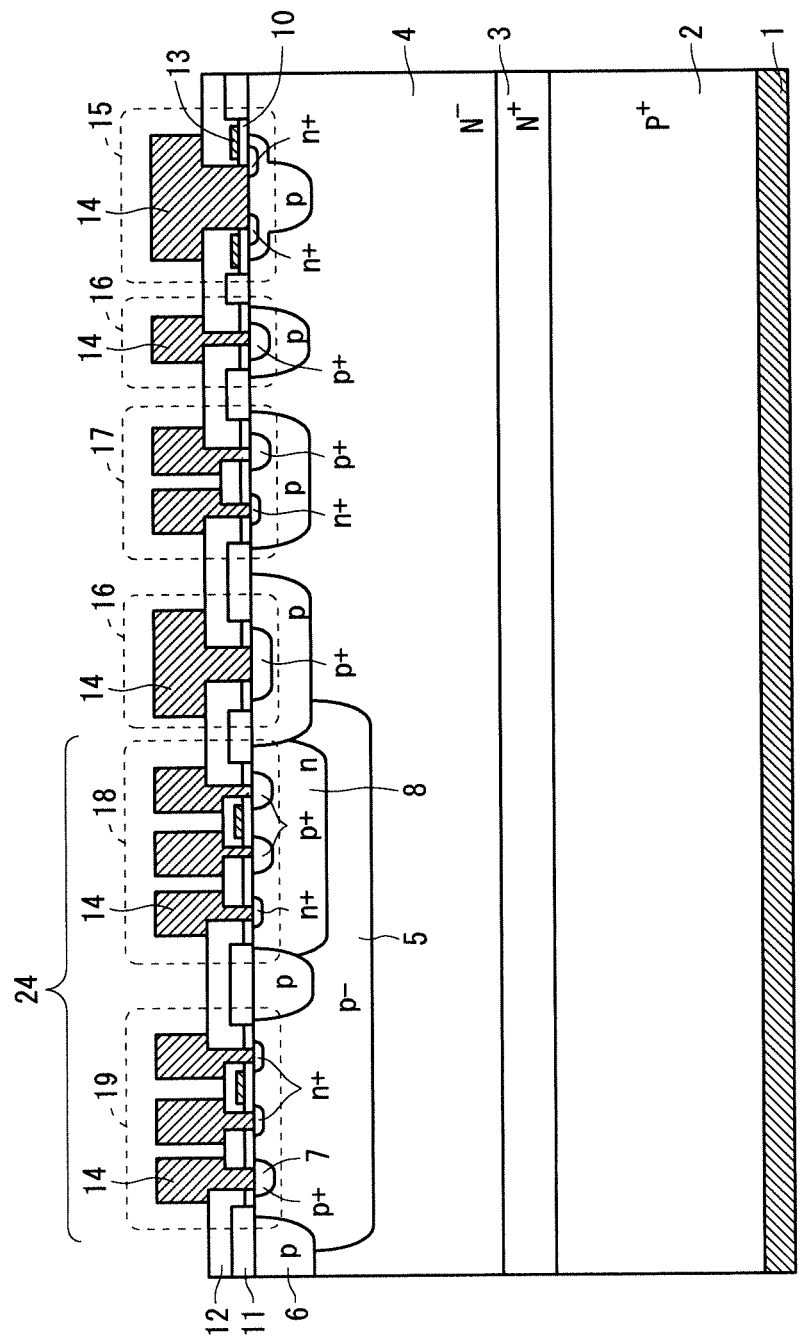
FIG. 14 is a cross-sectional view of a semiconductor device according to a prerequisite technique.

Prior to the description of the embodiments, the following describes a prerequisite technique relating to the present invention. FIG. 14 is a cross-sectional view of a semiconductor device according to the prerequisite technique relating to the present invention. FIG. 15 is a plan view of the same. As illustrated in FIG. 14, the semiconductor device includes an IGBT 15, thyristor 17, circuit region 24, and hole-current retrieval region 16 disposed within the same semiconductor substrate. The circuit region 24 is provided with a PchMOSFET 18 and an NchMOSFET 19.

As illustrated in FIG. 14, the PchMOSFET 18 contains a parasitic element (thyristor structure) that includes a P+ collector layer 2, an N− drift layer 4 (N+ buffer layer 3), a p− diffusion layer 5, and a negative diffusion layer (n+ diffusion layer). The NchMOSFET 19 likewise contains a parasitic element that includes the P+ collector layer 2, the N− drift layer 4 (N+ buffer layer 3), the p− diffusion layer 5, and the negative diffusion layer 8 (n+ diffusion layer).

When the N− drift layer 4 receives hole current from the P+ collector layer 2 on the back surface of the substrate during the drive of the IGBT 15, the hole current enters not only a positive diffusion layer of the IGBT 15 on the top layer of the semiconductor substrate, but also the p− diffusion layer 5 of the circuit region 24. At this time, upon the entrance of a hole current equal to or greater than a given level into the circuit region 24, the parasitic elements of the PchMOSFET 18 and NchMOSFET 19 operate to result in destruction due to latch-up.

To avoid the destruction due to the latch-up, the hole-current retrieval region 16 for retrieving the hole current is disposed between the IGBT 15 and the circuit region 24, as illustrated in FIG. 15.

In the prerequisite technique, the IGBT 15 needs to have a conduction capability of several amperes in order to drive an inductive load. Hence, the IGBT 15 occupies a half or more of the area of a chip, as illustrated in FIG. 15.

Accordingly, the prerequisite technique needs to establish the compatibility between a high conduction capability of the IGBT 15 and the avoidance of a parasitic operation in the circuit region 24. Hence, the semiconductor substrate needs to be composed of an epitaxial wafer that includes the N+ buffer layer 3 that is thick and has a high concentration, so that the IGBT 15 has a punch-through structure (hereinafter referred to as a PT structure). Alternatively, the IGBT 15 and the circuit region 24 need to be spaced apart from each other by equal to or greater than a certain distance, and then the hole-current retrieval region 16 needs to be disposed in a space therebetween. As a result, it is difficult to miniaturize the semiconductor device or reduce the amount of time for manufacturing the semiconductor device.

<First Embodiment>

Figure 1:
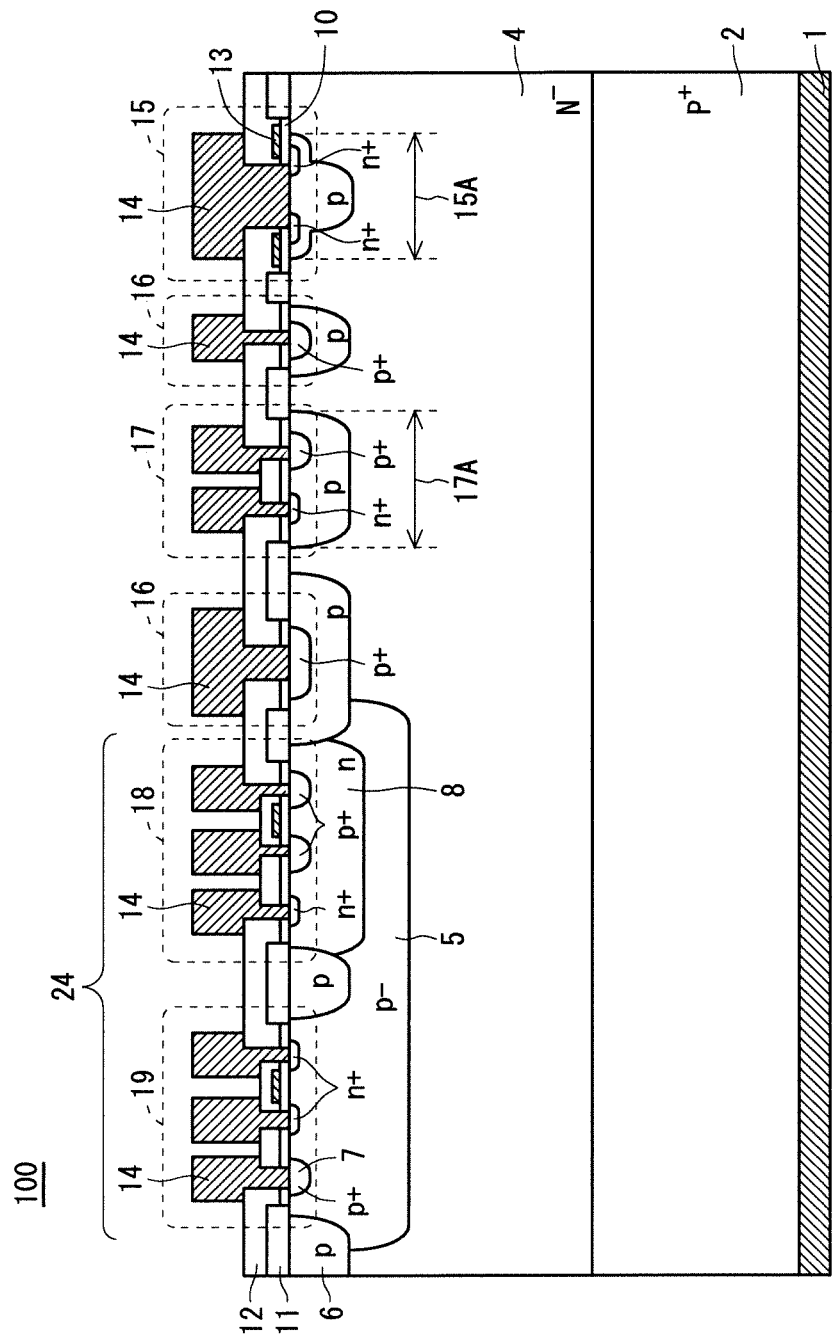
FIG. 1 is a cross-sectional view of a semiconductor device according to a first embodiment.

FIG. 1 is a cross-sectional view of a semiconductor device 100 according to a first embodiment. FIG. 2 is a plan view of the same. As illustrated in FIG. 1, the semiconductor device 100 includes an IGBT 15, thyristor 17, circuit region 24, and hole-current retrieval region 16 disposed on a first main surface of the same semiconductor substrate. The circuit region 24 is provided with a PchMOSFET 18 and an NchMOSFET 19.

In the first embodiment, the semiconductor substrate of the semiconductor device 100 is provided with a drift layer (i.e., N− drift layer 4) of a first conductivity type (i.e., N-type). Disposed on a second main surface (i.e., back surface) of the semiconductor substrate is a diffusion layer (i.e., P+ collector layer 2) of a second conductivity type (i.e., P-type). The second main surface of the semiconductor substrate is covered with a metal layer 1.

Reference is made to a configuration of the IGBT 15. A positive diffusion region is disposed on a first main surface (i.e., upper surface) of the N− drift layer 4. Further, two n+ diffusion layers are disposed in the positive diffusion region. In addition, gates 13 are disposed above the positive diffusion region and above the n+ diffusion layers through oxide films 10. Further, a metal electrode 14 that serves as an emitter is disposed on the positive diffusion region and on the n+ diffusion layers. The metal electrode 14 and the gates 13 are insulated from each other by an insulating film 12.

Reference is made to a configuration of the thyristor 17. A positive diffusion region is disposed on the first main surface (i.e., upper surface) of the N− drift layer 4, which is composed of the semiconductor substrate of the n-type. Further, an n+ diffusion region 9 and a p+ diffusion region are disposed in the positive diffusion region. Metal electrodes 14 are disposed on the respective n+ diffusion region 9 and p+ diffusion region.

Reference is made to a configuration of the PchMOSFET 18, which is disposed in the circuit region 24. A p− diffusion layer 5 is disposed on the first main surface of the N− drift layer 4. The p− diffusion layer 5 is shared with the NchMOSFET 19. A negative diffusion layer 8 is disposed in a region of the p− diffusion layer 5, corresponding to the PchMOSFET 18. Further, an n+ region, a p+ region, and another p+ region are sequentially arranged at intervals in the negative diffusion layer 8. A gate is disposed between the two p+ regions through an oxide film. An electrode that corresponds to a drain is disposed above the n+ region. Electrodes each of which corresponds to a drain or source are disposed on the respective two p+ regions.

Reference is made to a configuration of the NchMOSFET 19 in the circuit region 24. The p− diffusion layer 5, which is shared with the PchMOSFET 18, is disposed on the first main surface of the N− drift layer 4. Further, a p+ region 7, an n+ region, and another n+ region are sequentially arranged at intervals in the p− diffusion layer 5. A gate is disposed between the two n+ regions through an oxide film. An electrode that corresponds to a drain is disposed on the p+ region 7. Electrodes each of which corresponds to a drain or source are disposed on the respective two n+ regions.

As illustrated in FIG. 2, the IGBT 15 and the thyristor 17 are adjacent to each other with the hole-current retrieval region 16 interposed therebetween. In the first embodiment, the IGBT 15 has an effective area equal to or less than an effective area of the thyristor 17. The IGBT 15 has a conduction capability enough to drive at least the thyristor 17. The hole-current retrieval region 16 is disposed between the circuit region 24 and the IGBT 15.

Here, the effective area of each of the IGBT 15 and the thyristor 17 is the area of an element-activation region in which a vertical switching element operates. For example, FIG. 1 shows that the effective area of IGBT 15 is equivalent to the area of a region 15A in which a p-well (positive diffusion region) is exposed to the front surface of the substrate. FIG. 1 also shows that the effective area of the thyristor 17 is equivalent to the area of a region 17A in which a p-well (positive diffusion region) is exposed to the front surface of the substrate.

The semiconductor device (see FIGS. 14 and 15) in the prerequisite technique, which is configured such that the IGBT 15 has an additional function of driving the inductive load (coils of a transformer), needs to have a conduction capability of several amperes. Accordingly, the semiconductor device in the prerequisite technique needs to allocate a large effective area of the IGBT 15. The IGBT 15 thus occupies a half or more of the chip, as illustrated in FIG. 15. Nevertheless, another function of the IGBT 15, i.e., the driving of the thyristor 17 for the detection of a collector voltage simply needs a conduction capability of approximately several milliamperes.

The IGBT 15 in the first embodiment no longer has the function of the inductive-load drive, which belongs to the IGBT 15 in the prerequisite technique; instead, the function of the IGBT 15 lies in the driving of the thyristor 17 alone. Accordingly, the IGBT 15 in the first embodiment is configured so as to allocate a minimum effective area necessary to drive the thyristor 17. In other words, the first embodiment reduces a required conduction capability of the IGBT 15 from approximately several amperes to approximately several milliamperes when compared with the prerequisite technique. The reduced conduction capability of the IGBT 15 involves a reduced effective area of the IGBT 15. The effective area of the IGBT 15 in the first embodiment is reduced by approximately one-tenth to one-thousandth of the effective area of the IGBT 15 in the prerequisite technique, provided that the thyristor 17 in the prerequisite technique (FIG. 15) has the same effective area as that of the thyristor 17 in the first embodiment (FIG. 2).

<Effect>

The semiconductor device 100 in the first embodiment includes the following: the insulated-gate bipolar transistor 15 disposed on the first main surface of the semiconductor substrate provided with the drift layer (N– drift layer 4) of the first conductivity type (i.e., N-type); the thyristor 17 disposed on the first main surface of the semiconductor substrate; the circuit region 24 disposed on the first main surface of the semiconductor substrate, the circuit region 24 including a CMOS circuit element (i.e., PchMOSFET 18 and NchMOSFET 19); the hole-current retrieval region 16 disposed on the first main surface of the semiconductor substrate, the hole-current retrieval region 16 separating the insulated-gate bipolar transistor 15 and the circuit region 24 in a plan view; and the diffusion layer (i.e., P+ collector layer 2) of the second conductivity type (i.e., P-type), the diffusion layer being disposed on the second main surface of the semiconductor substrate. The insulated-gate bipolar transistor 15 has an effective area equal to or less than an effective area of the thyristor 17 in a plan view.

In the first embodiment, the IGBT 15 no longer has the function of the inductive-load drive; instead, the function of the IGBT 15 lies in the driving of the thyristor 17 alone. This specialized function reduces the required conduction capability of the IGBT 15 from approximately several amperes to approximately several milliamperes when compared with that in the prerequisite technique. In other words, the specialized function greatly reduces the amount of hole injections from the P+ collector layer 2. This eliminates the need for placing an N+ buffer layer 3 in the semiconductor substrate, thereby enabling a reduction in the amount of time for manufacturing the semiconductor substrate (epitaxial wafer).

The first embodiment enables the effective area of the IGBT 15 to be reduced by equal to or less than the half of the effective area of the thyristor 17. The first embodiment also enables a reduced distance between the IGBT 15 and the circuit region 24, and enables a reduced area of the hole-current retrieval region 16, when compared with the prerequisite technique. Consequently, a small semiconductor device is achieved.

<Second Embodiment>

Figure 3:
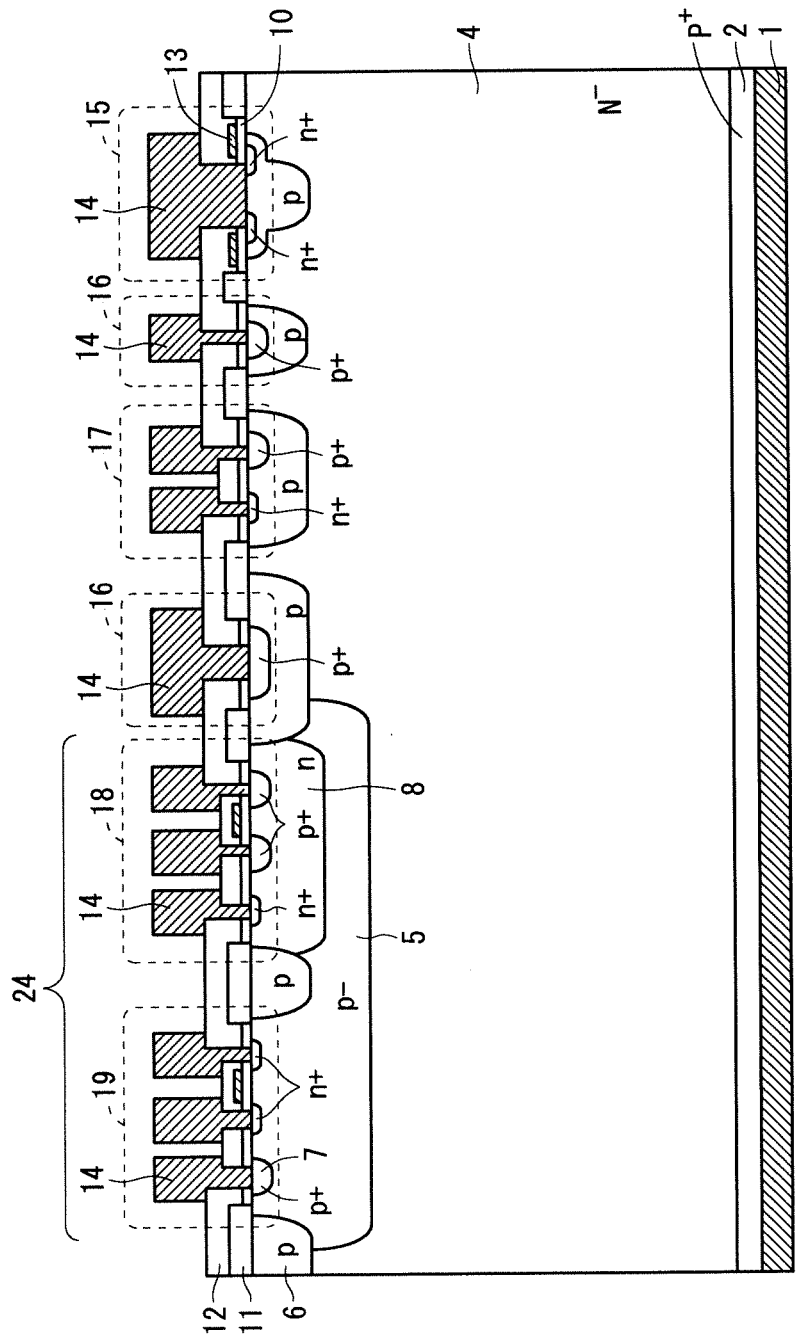
FIG. 3 is a cross-sectional view of a semiconductor device according to a second embodiment.

FIG. 3 is a cross-sectional view of a semiconductor device 200 according to a second embodiment. The semiconductor device 200 in the second embodiment includes a P+ collector layer 2 thinner than that of the semiconductor device 100 (FIG. 1). The other components, which are the same as those of the semiconductor device 100, are not described herein.

FIG. 4A to FIG. 4F are diagrams illustrating process steps for manufacturing the semiconductor device 200. The second embodiment deals with a wafer with a semiconductor substrate doped with a dopant of a second conductivity type (i.e., N-type).

In the second embodiment, the first step (FIG. 4A) is making the wafer by a FZ method or a Magnetic Czochralski (MCz) method.

The next step (FIG. 4B) is forming elements such as the IGBT 15, the thyristor 17, the circuit region 24, and the hole-current retrieval region 16 on the first main surface of the semiconductor substrate. The following step (FIG. 4C) is reducing the semiconductor substrate to a desired thickness.

The next step (FIG. 4D) is doping the second main surface of the semiconductor substrate with a trivalent atom such as boron (B). The following step (FIG. 4E) is laser-annealing the semiconductor substrate to activate the dopant as doped for forming the P+ collector layer 2. The final step (FIG. 4F) is forming the metal layer 1 on the second main surface of the semiconductor substrate.

<Effect>

In the second embodiment, the semiconductor device 200 includes the diffusion layer (i.e., P+ collector layer 2) formed by doping the second main surface of the semiconductor substrate with the dopant, followed by laser-annealing the second main surface of the semiconductor substrate.

A method for manufacturing the semiconductor device 200 in the second embodiment includes the following steps: (a) doping the second main surface of the semiconductor substrate with the dopant; and (b) after the step (a), laser-annealing the second main surface of the semiconductor substrate to form the diffusion layer.

Epitaxial growth of the N– drift layer 4 on the P+ collector layer 2 that is formed by a Czochralski (Cz) method, is time-consuming in the step of epitaxy. Meanwhile, the second embodiment deals with doping the wafer, which is doped with the N-type dopant, with a P-type dopant, followed by laser-annealing the wafer to form the P+ collector layer 2. Consequently, the second embodiment greatly reduces the amount of time for manufacturing the semiconductor device 200. Further, adjusting a doping condition or a laser-annealing condition specifies a dopant concentration of the P+ collector layer 2 or a depth of the P+ collector layer 2. This facilitates parameter specification and improves the controllability of the semiconductor device 200.

The method in the second embodiment allows the P+ collector layer 2 to be formed in a shallow site. This reduces the amount of hole injections from the collector, thereby enabling improved avoidance of the parasitic operation in the circuit region 24.

<Third Embodiment>

A semiconductor device 300 in a third embodiment is configured in the same manner as the semiconductor device 200 (FIG. 3). Thus, the description of the semiconductor device 300 is provided with reference to FIG. 3.

A method for manufacturing the semiconductor device 300 in the third embodiment includes the following process steps: doping the second main surface of the semiconductor substrate with the dopant, followed by forming the metal layer 1 on the second main surface without the laser-annealing process. The method also includes a process step of, after the formation step, heating the semiconductor substrate at 300° C. or higher and 400° C. or lower to establish ohmic contact between the metal layer 1 and the P+ collector layer 2. As a result of this heat treatment, the dopant is activated to form the P+ collector layer 2.

The dopant as doped commonly has an activation rate of more than 50% in the laser-annealing process, whereas the dopant has an activation rate of less than 1% in the heat treatment at 300° C. or higher and 400° C. or lower. In other words, the P+ collector layer 2 in the third embodiment has a carrier concentration smaller than that in the second embodiment. Consequently, the third embodiment reduces the injection of the hole current, thereby enabling improved avoidance of the parasitic operation in the circuit region 24.

<Effect>

The semiconductor device 300 in the third embodiment further includes the metal layer 1 over the diffusion layer (i.e., P+ collector layer 2), the metal layer 1 being exposed to the second main surface of the semiconductor substrate. The diffusion layer and the metal layer 1 are in ohmic contact with each other. The diffusion layer contains the dopant of the second conductivity type, the dopant having an activation rate of less than 1%.

Thus, the third embodiment further reduces the carrier concentration of the P+ collector layer 2 than the second embodiment. Consequently, the third embodiment reduces the injection of the hole current, thereby enabling further improved avoidance of the parasitic operation in the circuit region 24.

The semiconductor device 300 in the third embodiment further includes the metal layer 1 over the diffusion layer (i.e., P+ collector layer 2), the metal layer 1 being exposed to the second main surface of the semiconductor substrate. In addition, the method for manufacturing the semiconductor device 300 in the third embodiment includes the following steps: (c) doping the second main surface of the semiconductor substrate with the dopant; (d) after the step (c), forming the metal layer 1 on the second main surface of the semiconductor substrate; and (e) after the step (d), heating the semiconductor substrate at 300° C. or higher and 400° C. or lower to form the diffusion layer (i.e., P+ collector layer 2).

The second main surface of the semiconductor substrate is doped with the dopant, then the metal layer 1 is formed on the second main surface of the semiconductor substrate, and then the semiconductor substrate undergoes heating. A series of these process steps enables the activation of the dopant to coincide with the establishment of the ohmic junction between the semiconductor substrate and the metal layer 1. Further, the semiconductor substrate undergoes heating at 300° C. or higher and 400° C. or lower. This process step enables the dopant of the P+ collector layer 2 to have the activation rate of less than 1%, thereby reducing the carrier concentration of the P+ collector layer 2.

<Fourth Embodiment>

The semiconductor device 400 according to a fourth embodiment is configured in the same manner as the semiconductor device 200 (FIG. 3). Thus, the description of the semiconductor device 400 is provided with reference to FIG. 3. In the fourth embodiment, the semiconductor substrate is designed to have a threshold thickness enough to have a conduction capability necessary to drive the thyristor 17.

Consequently, the fourth embodiment reduces the amount of hole-current injections from the P+ collector layer 2 without losing the function of the IGBT 15 and the function of the thyristor 17, thereby enabling further improved avoidance of the parasitic operation in the circuit region 24 than the second and third embodiments.

When a wafer made by a FZ method or a MCz method is used, the N– drift layer 4, which corresponds to a base region of a vertical PNP transistor of the IGBT 15, commonly has the same thickness as that of the semiconductor substrate. Elements, such as the IGBT 15, the thyristor 17, and the circuit region 24 are formed on the top layer of the substrate, and then the back surface of the substrate is reduced. A series of this process steps enables the substrate to have a given thickness. Adjusting the thickness of the semiconductor substrate, i.e., the thickness of the N– drift layer 4 facilitates the regulation of an amplification factor of the vertical PNP transistor.

In a power semiconductor device, the N– drift layer 4 is set to have a minimum thickness in view of, for instance, a trade-off between a switching loss and a breakdown voltage of an element, the degree of warping of a wafer, or a bending strength of a chip. Meanwhile, the present invention deals with the IGBT 15 whose function lies in driving the thyristor 17, and thus eliminates the need for reflecting a switching loss of the IGBT 15 or the breakdown voltage of the element.

<Effect>

The semiconductor device 400 in the fourth embodiment is configured such that the drift layer (i.e., N– drift layer 4) composed of the semiconductor substrate has a thickness that is an upper limit for a thickness within which the thyristor 17 is drivable.

Consequently, the fourth embodiment reduces the amount of hole-current injections from the P+ collector layer 2 without losing the function of the IGBT 15 and the function of the thyristor 17, thereby enabling the further improved avoidance of the parasitic operation in the circuit region 24 than the second and third embodiments.

<Fifth Embodiment>

Figure 5:
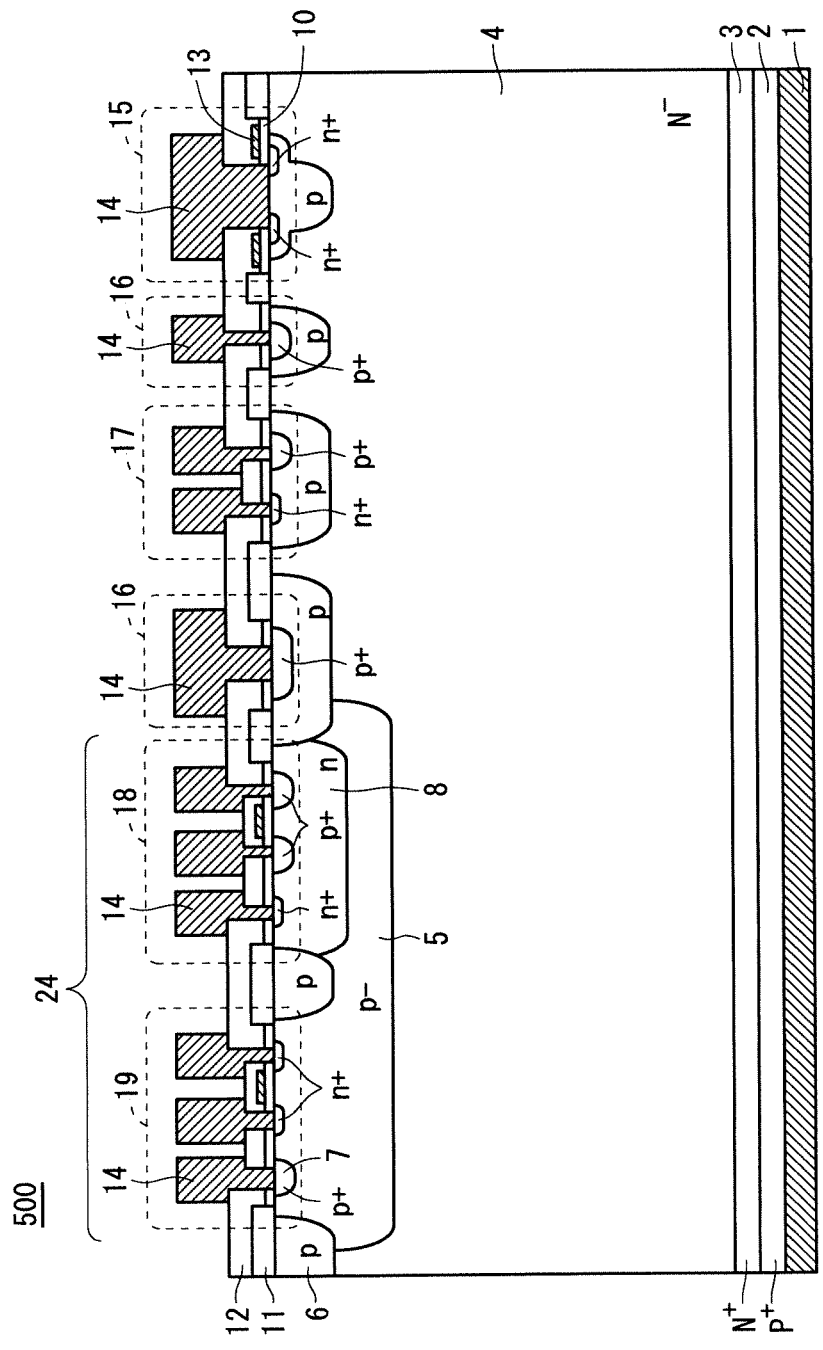
FIG. 5 is a cross-sectional view of a semiconductor device according to a fifth embodiment.

FIG. 5 is a cross-sectional view of a semiconductor device 500 according to a fifth embodiment. The semiconductor device 500 includes an N+ buffer layer 3 between the diffusion layer (P+ collector layer 2) and the N– drift layer 4. The N+ buffer layer 3 has a dopant concentration higher than that of the N– drift layer 4. The other components, which are the same as those of the semiconductor device 200 (FIG. 3), are not described herein.

The following describes a method for manufacturing the semiconductor device 500 in the fifth embodiment. In the fifth embodiment, the method includes doping the back surface of the semiconductor substrate with a pentavalent atom, such as arsenic (As) or phosphorous (P), followed by doping the back surface of the semiconductor substrate with a trivalent atom such as boron (B). The method also includes, after the doping step, laser-annealing the back surface of the semiconductor substrate to activate the dopants for forming the N+ buffer layer 3 within the semiconductor substrate.

<Effect>

The semiconductor device 500 further includes a buffer layer (i.e., N+ buffer layer 3) disposed between the diffusion layer and the drift layer. The buffer layer has a conductivity type identical to a conductivity type of the drift layer. The buffer layer has a carrier concentration than higher than a carrier concentration of the drift layer.

Providing the N+ buffer layer 3 further reduces the amount of hole-current injections from the P+ collector layer 2, thereby enabling further improved avoidance of the parasitic operation in the circuit region 24. In addition, the provision of the N+ buffer layer 3 reduces a leak current in high temperature, thereby reducing a junction temperature of the semiconductor device.

<Sixth Embodiment>

Figure 6:
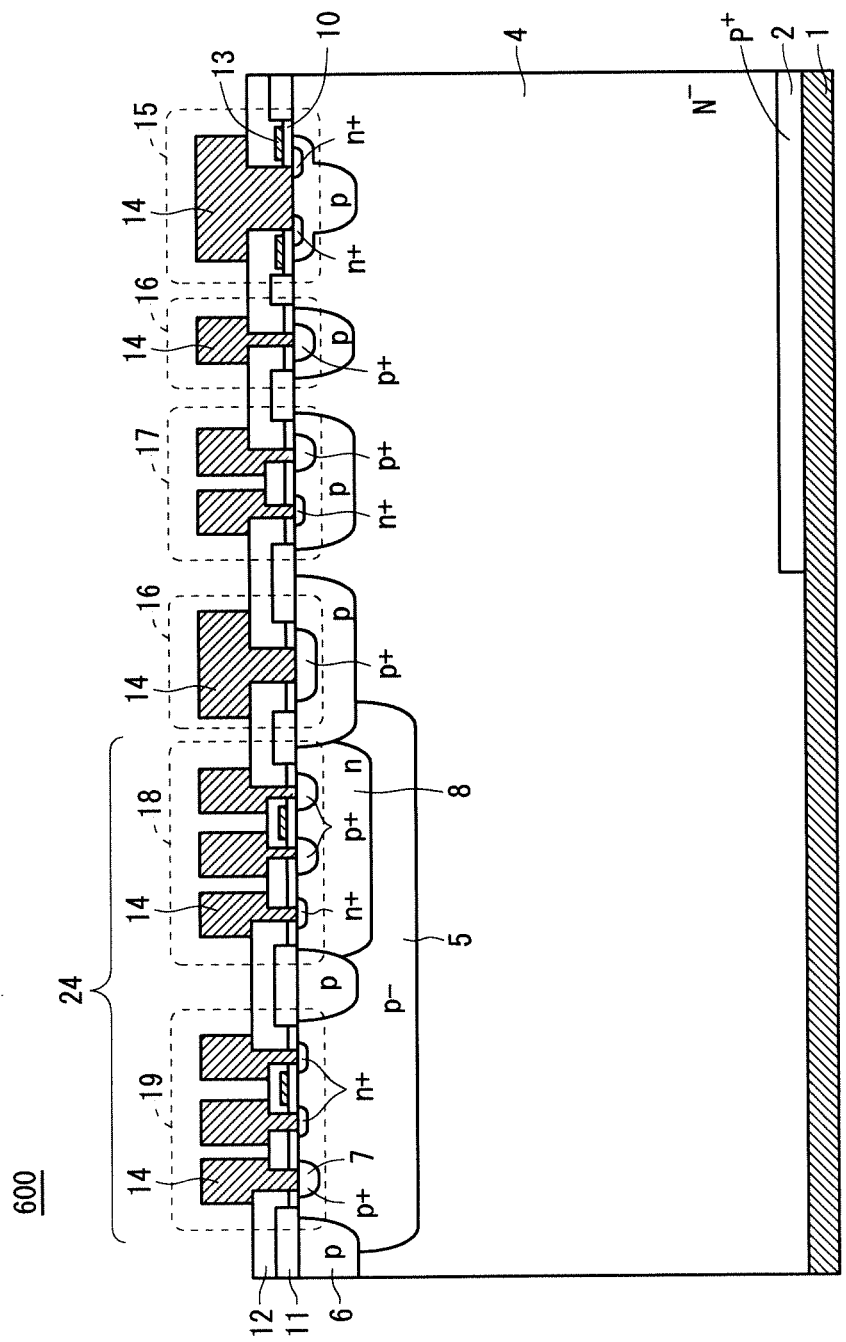
FIG. 6 is a cross-sectional view of a semiconductor device according to a sixth embodiment.

FIG. 6 is a cross-sectional view of a semiconductor device 600 according to a sixth embodiment. In the sixth embodiment, the semiconductor device 600 includes a diffusion layer (i.e., P+ collector layer 2) disposed in a region in which the diffusion layer is superposed on the IGBT 15 or the thyristor 17 in a plan view and is not superposed on the circuit region 24 in a plan view, as illustrated in FIG. 6.

A method for manufacturing the semiconductor device 600 in the sixth embodiment includes an additional step of forming a resist on the back surface of the semiconductor substrate with a photomask before doping the back surface of the semiconductor substrate with a trivalent atom such as boron (B). The resist formation on the back surface of the semiconductor substrate enables a given region to be doped with the trivalent atom such as boron (B). The sixth embodiment deals with forming the P+ collector layer 2 in only a region in which a vertical PNP transistor needs to be formed (i.e., region in which the P+ collector layer 2 is superposed on the IGBT 15 and the thyristor 17 in a plan view).

<Effect>

The semiconductor device 600 in the sixth embodiment is configured such that the diffusion layer (P+ collector layer 2) is disposed in the region in which the diffusion layer is superposed on the IGBT 15 or the thyristor 17 in a plan view and is not superposed on the circuit region 24 in a plan view.

Such a configuration provides the semiconductor device 600 with the circuit region 24 having no parasitic elements, without losing the function of the IGBT 15 and the function of the thyristor 17. Consequently, the sixth embodiment enables further improved avoidance of the parasitic operation in the circuit region 24 than the second and third embodiments. In addition, the sixth embodiment enables a reduced distance between the IGBT 15 and the circuit region 24, and also enables a reduced area of the hole-current retrieval region 16, thereby providing a small semiconductor device 600.

<Seventh Embodiment>

Figure 7:
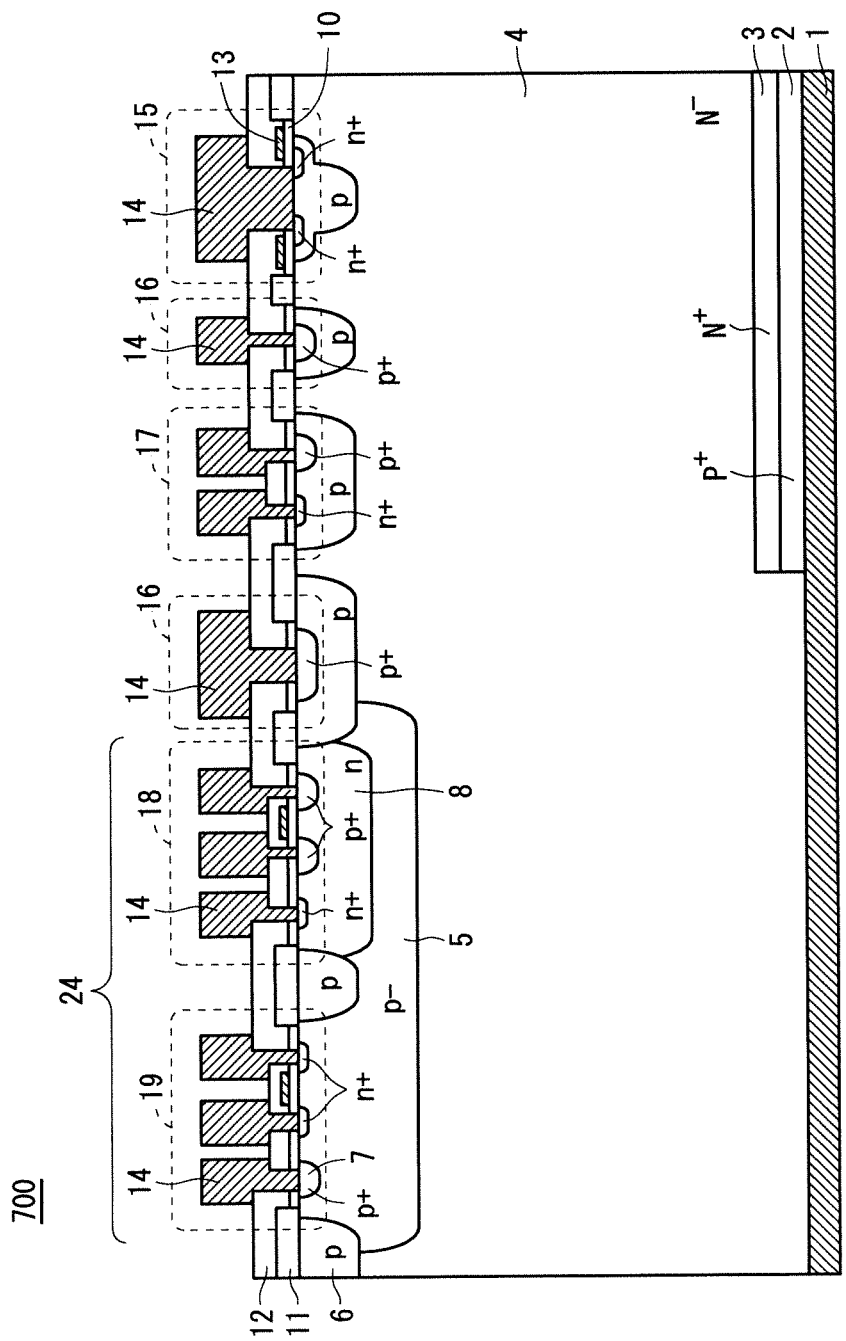
FIG. 7 is a cross-sectional view of a semiconductor device according to a seventh embodiment.

FIG. 7 is a cross-sectional view of a semiconductor device 700 according to a seventh embodiment. The semiconductor device 700 further includes the N+ buffer layer 3 between the P+ collector layer 2 and the N− drift layer 4, with respect to the semiconductor device 600 (FIG. 6). The N+ buffer layer 3 is provided to be superposed on the P+ collector layer 2 in a plan view.

The N+ buffer layer 3 is formed through the following steps: forming a resist on the back surface of the semiconductor substrate; and then selectively doping the back surface of the semiconductor substrate with a dopant.

<Effect>

The semiconductor device 700 in the seventh embodiment further includes a buffer layer (i.e., N+ buffer layer 3). The buffer layer is disposed between the diffusion layer (i.e., P+ collector layer 2) and the drift layer 4 so as to be superposed on the diffusion layer in a plan view. The buffer layer has a conductivity type identical to a conductivity type of the drift layer and has a carrier concentration higher than a carrier concentration of the drift layer.

Consequently, the seventh embodiment reduces the amount of hole injections from the P+ collector layer 2, thereby enabling further improved avoidance of the parasitic operation in the circuit region 24 than the sixth embodiment. In addition, the seventh embodiment enables a further reduced distance between the IGBT 15 and the circuit region 24 and further reduced area of the hole-current retrieval region 16 than the sixth embodiment, thereby providing a further small semiconductor device 700.

<Eighth Embodiment>

Figure 8:
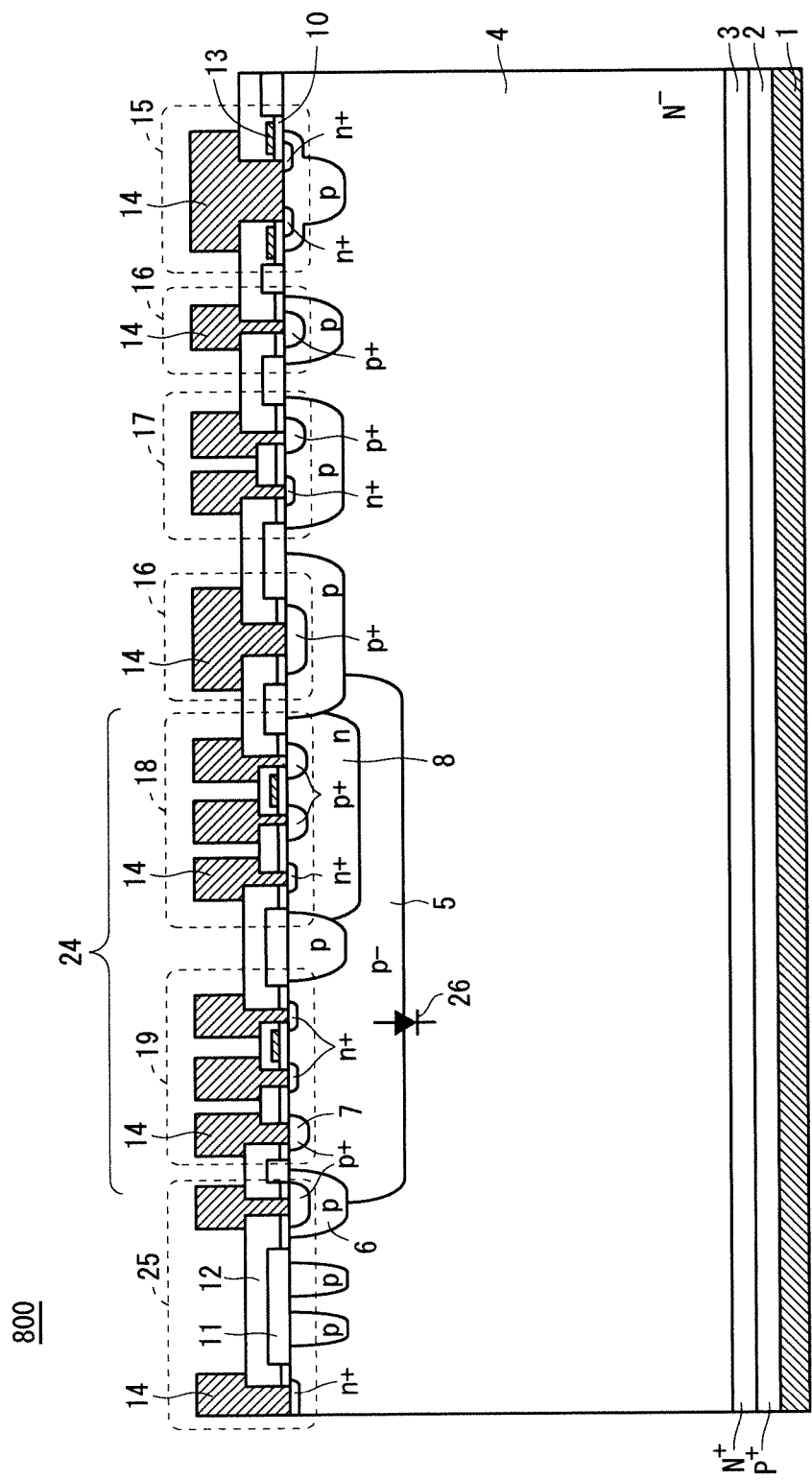
FIG. 8 is a cross-sectional view of a semiconductor device according to an eighth embodiment.

FIG. 8 is a cross-sectional view of a semiconductor device 800 according to an eighth embodiment. The semiconductor device 800 further includes an edge termination region 25 with respect to the semiconductor device 500 in the fifth embodiment. The edge termination region 25 is provided so as to surround the IGBT 15, the thyristor 17, the circuit region 24, and the hole-current retrieval region 16 in a plan view.

In the semiconductor device 800, the edge termination region 25 is designed to have a breakdown voltage smaller than a reverse breakdown voltage of a diode 26 disposed in the circuit region 24.

In a semiconductor device that includes the IGBT 15, a termination portion (corner portion) is commonly patterned to have a sectorial shape so that an electric-field concentration is reduced. However, when a positive voltage is applied to the P+ collector layer 2, a sectorial depletion layer extends in the termination portion, electric lines of force in the sectorial region are concentrated on the corner portion, electric fields are concentrated, and an avalanche breakdown (breakdown) is generated at a voltage lower than a theoretical breakdown voltage.

Accordingly, the following measures are taken for a reduction in the electric-field concentration: providing the edge termination region 25 in the termination portion; distributing destinations of the electric lines of force, which are concentrated on the terminal portion, from the termination of the device to the edge termination region.

In an internal-combustion ignition system, for instance, a semiconductor device that drives an inductive load (coils of a transformer) is configured such that a spark plug connected to a secondary coil of the transformer through the action of mutual induction of the coils of the transformer is caused to generate a spark discharge of several tens of kilovolts for ignition. Thus, an unexpected surge can occur in a collector. Accordingly, the semiconductor device needs to be designed so as to avoid its destruction if a surge of several kilovolts is applied to the collector.

Reference is made to the semiconductor device that includes the IGBT 15 and circuit region 24 on the same semiconductor substrate. When a positive surge is applied to the P+ collector layer 2, a reverse bias voltage is applied to the p− diffusion layer 5 in the circuit region and the diode 26 in the circuit region, composed of the N− drift layer 4. This causes punch-through in a vertical direction, so that the hole current is supplied to the circuit region 24. Consequently, a parasitic element in the circuit region 24 operates to thus destroy the elements disposed in the circuit region 24 due to latch-up.

<Effect>

The semiconductor device 800 in the eighth embodiment further includes the edge termination region 25. The edge termination region 25 surrounds the insulated-gate bipolar transistor 15, the thyristor 17, the circuit region 24, and the hole-current retrieval region 16 in a plan view. The edge termination region 25 has a breakdown voltage smaller than a reverse breakdown voltage of the diode 26 disposed in the circuit region 24.

In the eighth embodiment, the breakdown voltage of the edge termination region 25 is smaller than the reverse breakdown voltage of the diode 26, which is disposed in the circuit region 24. Consequently, when the positive surge is applied to the P+ collector layer 2, the avalanche breakdown is generated in the edge termination region 25 prior to the generation of the vertical punch-through. As a result, surge energy is absorbed from the termination region. This improves a capability of withstanding the positive surge of the collector.

<Ninth Embodiment>

Figure 9:
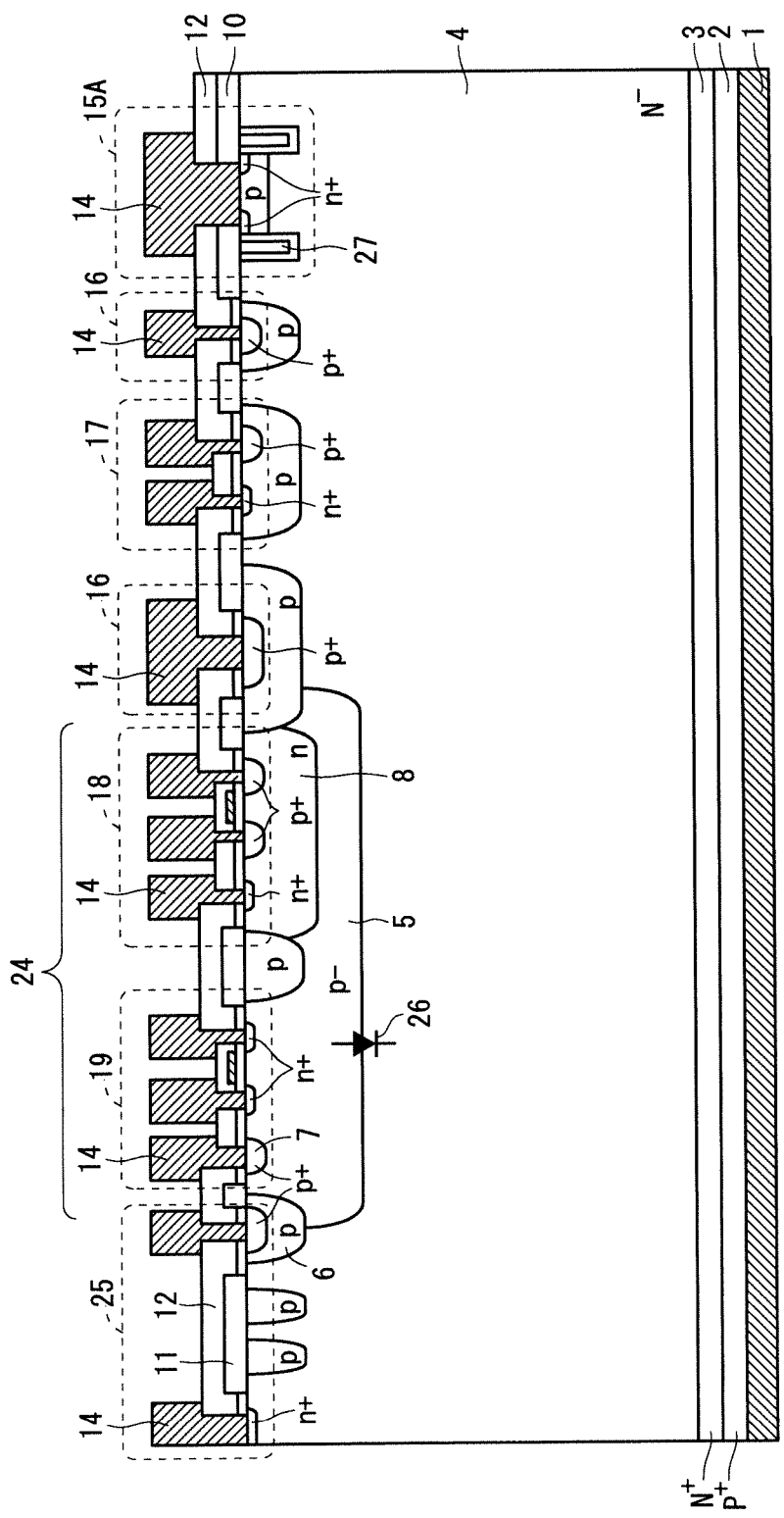
FIG. 9 is a cross-sectional view of a semiconductor device according to a ninth embodiment.

FIG. 9 is a cross-sectional view of a semiconductor device 900 according to a ninth embodiment. The semiconductor device 900 includes an IGBT 15A provided with trench gates 27. The other components are the same as those of the semiconductor device 800.

The IGBT 15A has a trench-gate structure. This enables an NchMOSFET of the IGBT 15A to have an improved conduction capability. Consequently, the N− drift layer 4 is designed to have a greater thickness. Thus, the diode 26 has an improved reverse breakdown voltage, so that the edge termination region 25 further absorbs a surge. As a result, the ninth embodiment further improves the capability of withstanding the positive surge of the collector than the eighth embodiment.

<Effect>

The semiconductor device 900 in the ninth embodiment is configured such that the insulated-gate bipolar transistor 15A is provided with the trench gate 27.

The trench gate 27 of the IGBT 15A provides a more thick N− drift layer 4 of the semiconductor substrate. This improves the reverse breakdown voltage of the diode 26, which is disposed in the circuit region 24, so that the edge termination region 25 further absorbs the surge.

<Tenth Embodiment>

Reference is made to the semiconductor device 600 in the sixth embodiment and the semiconductor device 700 in the seventh embodiment. The N− drift layer 4 having a low concentration and the metal layer 1 are in contact with each other in the region without the P+ collector layer 2 (e.g., region superposed on the circuit region 24 in a plan view). Accordingly, a Schottky junction is established between the N− drift layer 4 and the metal layer 1. The Schottky junction has a lower reverse breakdown voltage than a PN junction. Hence, when the P+ collector layer 2 is negative-biased, a negative current is generated in the portion in which the Schottky junction is established. Accordingly, the p− diffusion layer 5 has a potential higher than that of the N− drift layer 4, in a parasitic NPN transistor composed of the n+ layers, p− diffusion layer 5 and N− drift layer 4 of the NchMOSFET 19 in the circuit region 24, so that a base and an emitter are forward-biased. As a result, the parasitic transistor can operate to thus cause a malfunction of a circuit.

Figure 10:
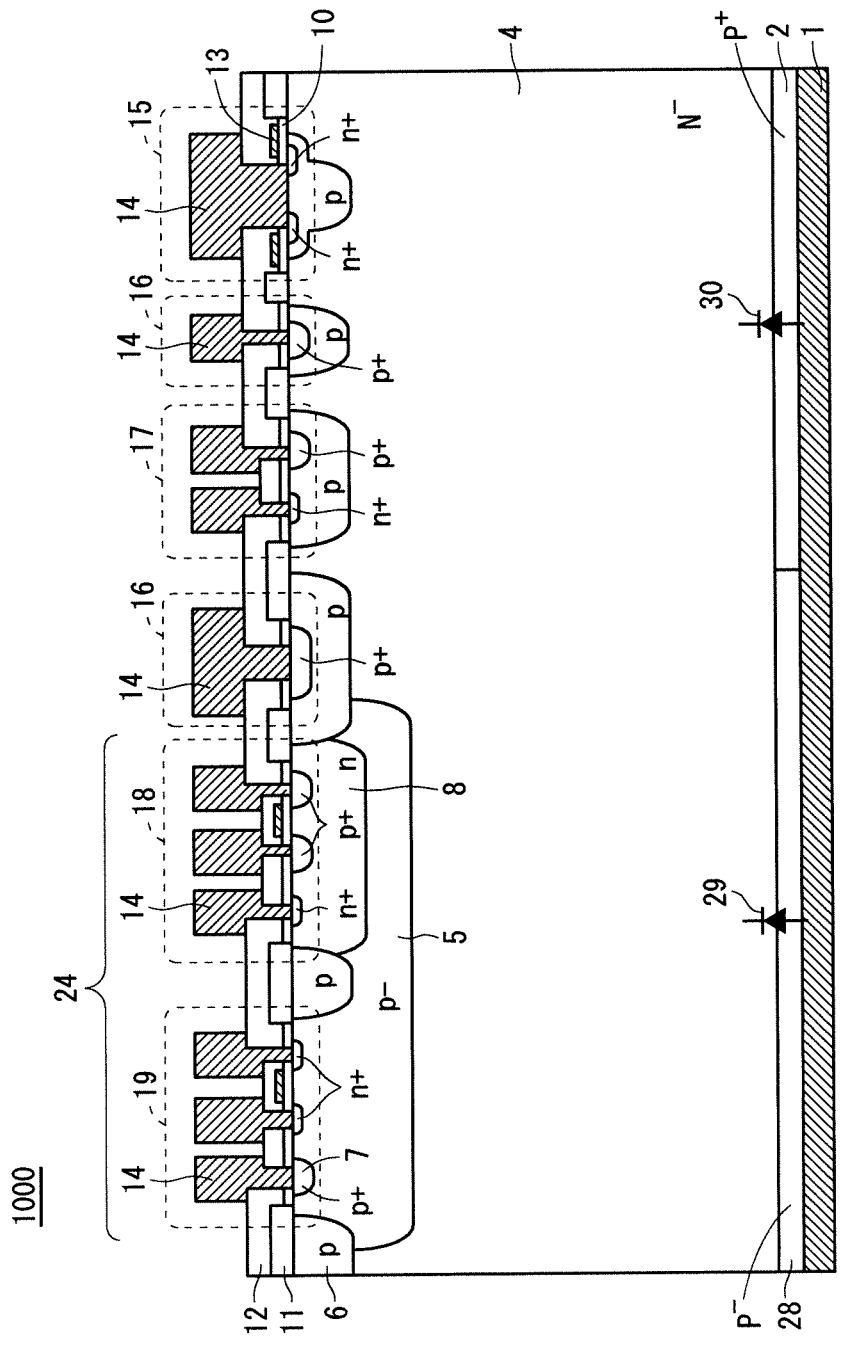
FIG. 10 is a cross-sectional view of a semiconductor device according to a tenth embodiment.

FIG. 10 is a cross-sectional view of a semiconductor device 1000 according to a tenth embodiment. In the tenth embodiment, the semiconductor device 1000 includes a P− collector layer 28 disposed in a region in which a Schottky junction is established. The P− collector layer 28 has a carrier concentration lower than that of the P+ collector layer 2. As illustrated in FIG. 10, the P− collector layer 28 and the N− drift layer 4 constitute a diode 29; in addition, the P+ collector layer 2 and the N− drift layer 4 constitute a diode 30. The semiconductor device 1000 in the tenth embodiment is configured such that the diode 29 has a reverse breakdown voltage smaller than a reverse breakdown voltage of the diode 30. Such a configuration would prevent a negative current from flowing through the circuit region 24 if a negative bias voltage is applied to the P− collector layer 28, thereby improving a capability of withstanding the malfunction of the elements disposed in the circuit region 24.

<Effect>

The semiconductor device 1000 in the tenth embodiment further includes a circuit-region diffusion layer (i.e., P− collector layer 28), and the metal layer 1 over a diffusion layer (P+ collector layer 2) and the circuit-region diffusion layer, the metal layer 1 being exposed to the second main surface of the semiconductor substrate. The circuit-region diffusion layer is disposed in a region in which the circuit-region diffusion layer is superposed on the circuit region 24 in a plan view, and the circuit-region diffusion layer is adjacent to the metal layer 1. The circuit-region diffusion layer has a conductivity type identical to a conductivity type of the diffusion layer (i.e., P+ collector layer 2), and has a carrier concentration lower than a carrier concentration of the diffusion layer. The diode 29 composed of the drift layer (i.e., N− drift layer 4) and the circuit-region diffusion layer has a reverse breakdown voltage smaller than a reverse breakdown voltage of the diode 30 composed of the drift layer and the diffusion layer.

This prevents the negative current from flowing through the circuit region 24, thereby enabling avoidance of the malfunction of the circuit region 24.

<Eleventh Embodiment>

Figure 11:
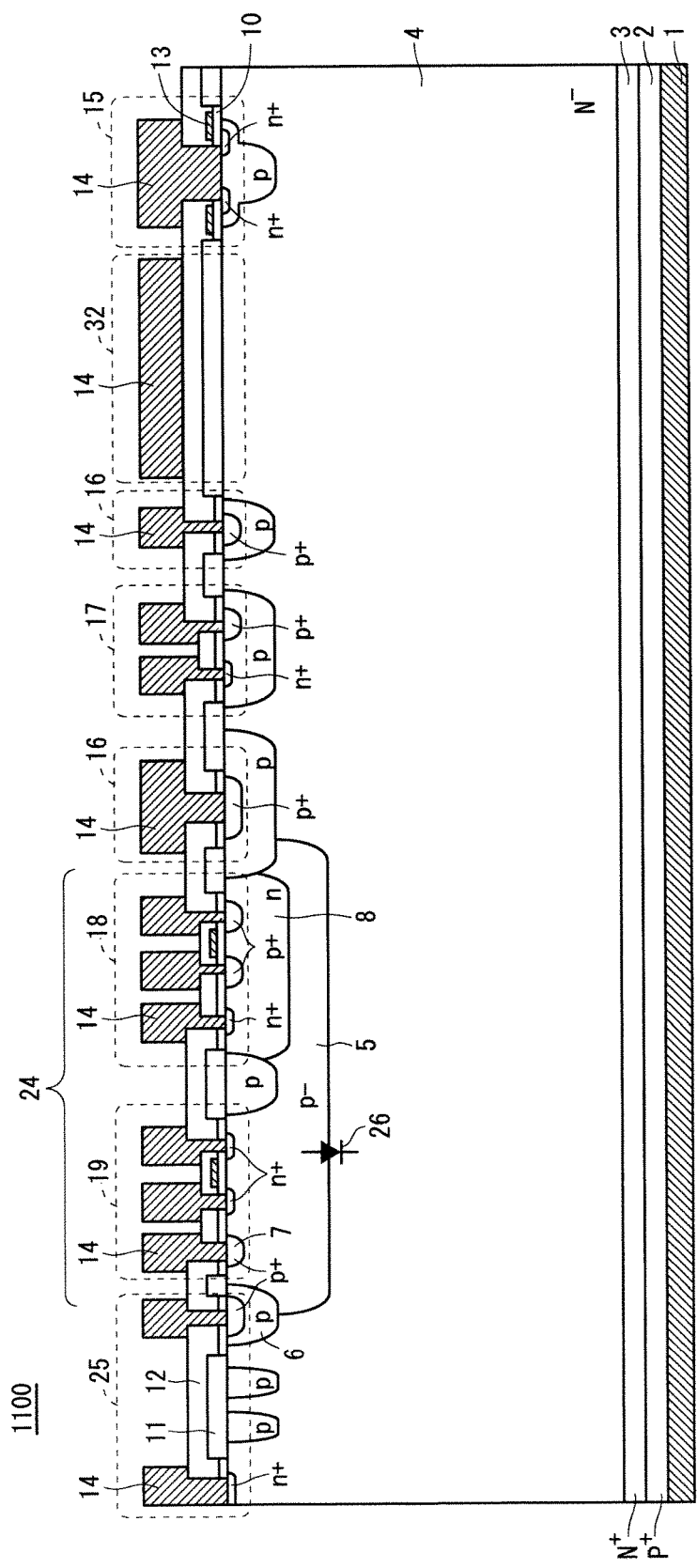
FIG. 11 is a cross-sectional view of a semiconductor device according to an eleventh embodiment.
Figure 12:
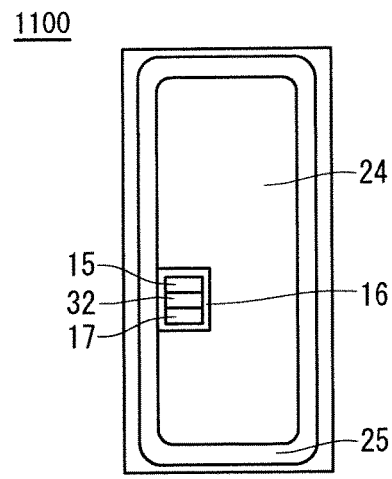
FIG. 12 is a plan view of the semiconductor device according to the eleventh embodiment.

FIG. 11 is a cross-sectional view of a semiconductor device 1100 according to an eleventh embodiment. FIG. 12 is a plan view of the same.

The semiconductor devices 200 to 900 according to the second to ninth embodiments reduce the hole-current injections from the P+ collector layer 2 on the back surface of the semiconductor substrate, thereby enabling improved avoidance of the parasitic operation in the circuit region 24. However, this degrades a conductivity modulation effect within the N− drift layer 4 during the operation of the IGBT 15 to thus lead to a rise in resistivity of the N− drift layer 4. In addition, a hole has a carrier density that decreases toward the top layer of the substrate; and a voltage drop is generated within the N− drift layer 4 on the top layer of the substrate, around an emitter electrode (p− diffusion layer) of the IGBT in accordance with a level of the hole current.

In an effort to detect a collector voltage of the IGBT 15 using the thyristor 17, a voltage level detected by the thyristor 17 relies on a potential of the N− drift layer 4 near a positive diffusion portion (base) of an NPN transistor during the operation of the IGBT 15. Thus, a smaller distance between the IGBT 15 and the thyristor 17 produces a difference between the voltage level, which is detected by the thyristor 17, and an actual collector voltage of the IGBT 15 under the influence of the voltage drop, which is generated within the N− drift layer 4. In other words, such a smaller distance decreases a capability of detecting the collector voltage.

In the present invention, the IGBT 15 needs to have a current capability of several milliamperes for the drive, as earlier mentioned in the first embodiment. In this case, a simulation of the device as well as the production and experiment of a prototype have confirmed that a distance of 100 µm or more, between the IGBT 15 and the thyristor 17 can eliminate the influence of the aforementioned voltage drop. However, the mere provision of the distance increases the area of the semiconductor device.

Accordingly, the semiconductor device 1100 in the eleventh embodiment includes a bonding pad region 32 that is moved from another region to a region that spaces the IGBT 15 and the thyristor 17 apart from each other. The bonding pad region 32 is used for joining a conductive wiring material such as an aluminum wire to the metal electrode 14.

<Effect>

The semiconductor device 1100 according to the eleventh embodiment includes the bonding pad region 32 provided with the metal electrode 14. The insulated-gate bipolar transistor 15 and the thyristor 17 are spaced apart from each other by 100 µm or more in a plan view. The bonding pad region 32 is disposed in a region that spaces the insulated-gate bipolar transistor 15 and the thyristor 17 by 100 µm or more.

The bonding pad region 32 is disposed in the region that spaces the IGBT 15 and the thyristor 17 apart from each other. Such a configuration prevents an increase in area of the semiconductor device 1100, and prevents the degradation of a collector-voltage detection capability of the thyristor 17.

<Twelfth Embodiment>

The semiconductor substrate of the semiconductor device 100 according to the first embodiment is a silicon substrate. A twelfth embodiment deals with a silicon carbide (SiC) semiconductor substrate as the semiconductor substrate of the semiconductor device. Silicon carbide, which has a breakdown electric-field strength approximately 10 times stronger than that of silicon and has a bandgap approximately 3 times greater than that of silicon, provides a thin semiconductor substrate and a reduced edge termination region 25. This enables the semiconductor device to be small and to be further resistant to heat.

The semiconductor substrate of the semiconductor devices 200 to 1100 according to the second to eleventh embodiments may be a SiC semiconductor substrate. In this case, a similar effect is achieved.

<Thirteenth Embodiment>

Figure 13:
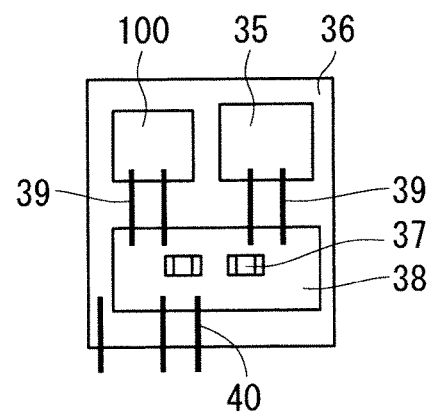
FIG. 13 is a plan view of a semiconductor device according to a thirteenth embodiment.

FIG. 13 is a plan view of a semiconductor module according to a thirteenth embodiment. The semiconductor module in this embodiment includes the semiconductor device 100 in the first embodiment, a power semiconductor device 35, and an insulating substrate 38. The semiconductor device 100 serves as a control IC. The power semiconductor device 35 includes, for instance, an IGBT, which is a power semiconductor element. This IGBT drives, for instance, an inductive load (coils of a transformer) in an ignition system for an internal-combustion engine such as an automobile engine. Disposed on the insulating substrate 38 are passive elements 37, such as a capacitor and a resistor.

As illustrated in FIG. 13, the semiconductor device 100, the power semiconductor device 35, and the insulating substrate 38 are joined on a metal plate 36. The metal electrodes 14, which are disposed in the semiconductor device 100, and the insulating substrate 38 are electrically connected to each other through two or more wires 39. The power semiconductor device 35 and the insulating substrate are electrically connected to each other through two or more wires 39.

In this embodiment, although the semiconductor module includes the semiconductor device 100 according to the first embodiment, the semiconductor module may include any one of the semiconductor devices described in the first to twelfth embodiments, in place of the semiconductor device 100.

<Effect>

The semiconductor module in the thirteenth embodiment includes the semiconductor device 100, the power semiconductor device, and the insulating substrate 38 on which the passive elements 37 are disposed. The semiconductor device 100 and the insulating substrate 38 are electrically connected to each other through the two or more wires 39. The power semiconductor device 35 and the insulating substrate 38 are electrically connected to each other through the two or more wires 39. Wires 40 for input and output are connected to the insulating substrate 38 and the metal plate 36.

In such a configuration, the use of the semiconductor device 100 as the control IC improves a reliability of the control IC against a surge. This prevents the elements disposed in the semiconductor device 100 from being destroyed by a surge generated from a produced apparatus in a process step of assembling the module. This improves a capability of assembling the semiconductor module and a reliability of the semiconductor module.

With reference to the conductivity type of the semiconductor device, the first to thirteenth embodiments describe that the first conductivity type is specified as the N-type, and the second conductivity type is specified as the P-type. In some embodiment, the first conductivity type is specified as the P-type, and the second conductivity type is specified as the N-type. A semiconductor device having such conductivity types still provides a similar function.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

1 metal layer, 2 P+ collector layer, 3 N+ buffer layer, 4 N– drift layer, 5 p– diffusion layer, 6 positive diffusion region, 7 p+ diffusion region, 8 negative diffusion region, 10 gate oxide film, 11 oxide film, 12 insulating film, 13 gate, 14 metal electrode, 15 IGBT, 16 hole-current retrieval region, 17 thyristor, 18 PchMOSFET, 19 NchMOSFET, 24 circuit region, 25 edge termination region, 26, 29, 30 diode, 27 trench gate, 28 P– collector layer, 32 bonding pad region, 35 power semiconductor device, 37 passive element, 38 insulating substrate, and 39, 40 wire.

The invention claimed is:

1. A semiconductor device comprising:
an insulated-gate bipolar transistor disposed on a first main surface of a semiconductor substrate comprising a drift layer of a first conductivity type;
a thyristor disposed on said first main surface of said semiconductor substrate;
a circuit region disposed on said first main surface of said semiconductor substrate, said circuit region comprising a CMOS circuit element;
a hole-current retrieval region disposed on said first main surface of said semiconductor substrate, said hole-current retrieval region separating said insulated-gate bipolar transistor and said circuit region in a plan view; and
a diffusion layer of a second conductivity type, said diffusion layer being disposed on a second main surface of said semiconductor substrate, wherein said insulated-gate bipolar transistor has an effective area equal to or less than an effective area of said thyristor in a plan view.

2. The semiconductor device according to claim 1, wherein said diffusion layer is formed by doping said second main surface of said semiconductor substrate with a dopant, followed by laser-annealing said second main surface of said semiconductor substrate.

3. The semiconductor device according to claim 1, further comprising a metal layer over said diffusion layer, said metal layer being exposed to said second main surface of said semiconductor substrate, wherein
said diffusion layer and said metal layer are in ohmic contact with each other, and
said diffusion layer contains a dopant of said second conductivity type, said dopant having an activation rate of less than 1%.

4. The semiconductor device according to claim 1, wherein said drift layer, which is composed of said semiconductor substrate, has a thickness that is an upper limit for a thickness within which said thyristor is drivable.

5. The semiconductor device according to claim 1, further comprising a buffer layer, wherein
said buffer layer is disposed between said diffusion layer and said drift layer,
said buffer layer has a conductivity type identical to a conductivity type of said drift layer, and
said buffer layer has a carrier concentration higher than a carrier concentration of said drift layer.

6. The semiconductor device according to claim 1, wherein said diffusion layer is disposed in a region in which said diffusion layer is superposed on said insulated-gate bipolar transistor or said thyristor in a plan view and is not superposed on said circuit region in a plan view.

7. The semiconductor device according to claim 6, further comprising a buffer layer, wherein
said buffer layer is disposed between said diffusion layer and said drift layer,
said buffer layer has a conductivity type identical to a conductivity type of said drift layer, and
said buffer layer has a carrier concentration higher than a carrier concentration of said drift layer.

8. The semiconductor device according to claim 1, further comprising an edge termination region, wherein
said edge termination region surrounds said insulated-gate bipolar transistor, said thyristor, said circuit region, and said hole-current retrieval region in a plan view, and
said edge termination region has a breakdown voltage smaller than a reverse breakdown voltage of a diode disposed in said circuit region.

9. The semiconductor device according to claim 1, wherein said insulated-gate bipolar transistor comprises a trench gate.

10. The semiconductor device according to claim 6, further comprising:
a circuit-region diffusion layer; and
a metal layer over said diffusion layer and said circuit-region diffusion layer, said metal layer being exposed to said second main surface of said semiconductor substrate, wherein said circuit-region diffusion layer is disposed in a region in which said circuit-region diffusion layer are superposed on said circuit region in a plan view, said circuit-region diffusion layer being adjacent to said metal layer,
said circuit-region diffusion layer has a conductivity type identical to a conductive type of said diffusion layer, and has a dopant concentration lower than a dopant concentration of said diffusion layer, and
a diode comprising said drift layer and said circuit-region diffusion layer has a reverse breakdown voltage smaller than a reverse breakdown voltage of a diode comprising said drift layer and said diffusion layer.

11. The semiconductor device according to claim 1, further comprising a bonding pad region provided with a metal electrode, wherein
said insulated-gate bipolar transistor and said thyristor are spaced apart from each other by 100 μm or more in a plan view, and
said bonding pad region is disposed in a region that spaces said insulated-gate bipolar transistor and said thyristor by 100 μm or more.

12. The semiconductor device according to claim 1, wherein said semiconductor substrate is a SiC semiconductor substrate.

13. A semiconductor module comprising:
said semiconductor device according to claim 1;
a power semiconductor device; and
an insulating substrate on which a passive element is disposed, wherein
said semiconductor device and said insulating substrate are electrically connected to each other through two or more wires, and
said power semiconductor device and said insulating substrate are electrically connected to each other through two or more wires.

14. A method for manufacturing the semiconductor device according to claim 1, the method comprising the steps of:
(a) doping said second main surface of said semiconductor substrate with a dopant; and
(b) after said step (a), laser-annealing said second main surface of said semiconductor substrate to form said diffusion layer.

15. A method for manufacturing the semiconductor device according to claim 1,
the semiconductor device further comprising a metal layer over said diffusion layer, said metal layer being exposed to said second main surface of said semiconductor substrate,
the method comprising the steps of:
(c) doping said second main surface of said semiconductor substrate with a dopant;
(d) after said step (c), forming said metal layer on said second main surface of said semiconductor substrate; and
(e) after said step (d), heating said semiconductor substrate at a temperature of 300° C. or higher and 400° C. or lower to form said diffusion layer.

* * * * *